United States Patent [19]

Gorokhovsky

[11] Patent Number: 5,380,421

[45] Date of Patent: Jan. 10, 1995

[54] VACUUM-ARC PLASMA SOURCE

[76] Inventor: Vladimir I. Gorokhovsky, 10 Stonedene Blvd., Willowdale, Ontario, Canada, M2R 3C7

[21] Appl. No.: 145,570

[22] Filed: Nov. 4, 1993

[30] Foreign Application Priority Data

Nov. 4, 1992 [UA] Ukraine ............... 93020090

[51] Int. Cl.$^6$ ............................................. C23C 14/32
[52] U.S. Cl. ............................ 204/298.41; 204/192.38
[58] Field of Search ................... 204/298.41, 192.38; 118/723 R, 723 E, 723 ER

[56] References Cited

U.S. PATENT DOCUMENTS

| | | | |
|---|---|---|---|
| 3,783,231 | 1/1974 | Sablev et al. | 219/123 |
| 3,793,179 | 2/1974 | Sablev et al. | 204/298 |
| 3,836,451 | 9/1974 | Snaper | 204/298 |
| 4,448,659 | 5/1984 | Morrison, Jr. | 204/192 |
| 5,160,595 | 11/1992 | Hauzer et al. | 204/298.41 X |
| 5,306,407 | 4/1994 | Hauzer et al. | 204/192.38 |

Primary Examiner—R. Bruce Breneman
Assistant Examiner—Jonathan D. Baskin
Attorney, Agent, or Firm—Ridout & Maybee

[57] ABSTRACT

An apparatus for the production of coatings in a vacuum, including a rectangular cathode plate and primary and auxiliary anodes, is provided with static and dynamic magnetic stabilizing subsystems. The static stabilizing subsystem comprises linear conductors arranged parallel to the long sides of the cathode plate. The dynamic magnetic stabilizing subsystem includes a series of linear conductors arranged at right angles to the working surface of the cathode plate, activated in sequence. The static and dynamic magnetic stabilizing systems operate to stabilize the electric arc on the working surface of the cathode.

8 Claims, 2 Drawing Sheets

VACUUM-ARC PLASMA SOURCE

FIELD OF THE INVENTION

This invention relates to the production of coatings in a vacuum and, in particular, to devices designed to generate plasma of electrically conducting materials used for the production of coatings in a vacuum. This invention can be utilized in various fields of industry, i.e. in mechanical engineering, electronics, in the production of tools, etc.

BACKGROUND OF THE INVENTION

A vacuum-arc plasma source has been described in U.S. Pat. No. 4,448,659 in 1984. It contains a cathode in the form of a plate with a large surface area. For the stabilization of the arc the working surface of the plate supports a protective ring which surrounds the cathode. The ring is made of a material on which the formation of cathodic spots is less likely than on the cathode. This plasma source can be used for the production of coatings on large and long articles but it has the following disadvantages:

1. Despite the low probability of the presence of cathodic spots on the protective ring, the cathode material covers the ring as the evaporator works, so that cathodic spots are produced with increasing frequency. This results in the contamination of the coating by the ring material and in ring failure.
2. It is not possible in this apparatus to use a plasma magnetic focusing feature, as this would make the distribution of the cathodic spots on the working surface of the cathode irregular.

The absence of a magnetic focusing feature reduces the efficiency of the coating process, and impairs the quality of the coatings because the content of the neutral component (macroparticles, clusters and neutral atoms) in the coating increases.

3. The cathode in this type of plasma source becomes concave due to its decomposition, and therefore its useful life is short. Moreover, since the working surface of the cathode becomes concave over time, it is practically impossible to use a high-voltage pulse spark igniter in this design of plasma source, so that a mechanical igniter must be used which lowers working reliability and stability.

Information is provided for an electronic arc metal evaporator, as described in Certificate of Authorship No. 307660, M. $K_n$. C 13/12 of Sep. 9, 1968. This evaporator consists of a housing, a cathode, an igniting electrode and an anode. In order to maintain the stability of the arc the evaporator is provided with a magnetic coil located on the exterior of the housing, made of a non-magnetic material. The cathode is arranged coaxially inside the housing. The disadvantage of this plasma source is that it can not be used for the application of coatings to large and long articles. The size of the articles that can be coated is limited to 150 mm.

An apparatus of a similar nature is the vacuum-arc plasma source described in "Electric Arc Evaporator of Metals with Magnetic Confinement of Cathodic Spot", L. P. Sablev, et al, *Apparatus and Technique for Experiment*, 1976, No. 4, pp. 247-249 (in Russian). This vacuum-arc plasma source consists of a cathode with a working surface, a screen, a high-voltage igniting electrode, an auxiliary anode and a primary anode. The cathode is surrounded by a static magnetic stabilizing system which is produced by a magnetic coil. The magnetic force lines of the system are inclined toward the working face. The cathode, the primary and auxiliary anodes, and the screen are arranged coaxially. The apparatus also incorporates a dielectric sleeve. There is a circular gap between the side surface of the cathode and the auxiliary anode. The vacuum-arc plasma source is secured in a water-cooled flange. As this plasma source operates, the magnetic field holds the cathodic spot on the face of the tapered cathode.

This apparatus, like the one described above (see the Certificate of Authorship No. 307660) cannot be used for the application of coatings to large and long articles. For example, a good coating the thickness precision of which is 5 percent can be obtained on an article the size of which does not exceed 150 mm at a distance of 200 mm from the working face of the cathode.

The advantage presented by the present invention is the availability of producing high-quality coatings on large and long articles (500 mm and more). This advantage is vital to today's industry and will make it possible to significantly broaden the range of application of vacuum coatings.

The advantage arises through the use of a vacuum-arc plasma source which incorporates a cathode with the working surface surrounded by a static magnetic stabilizing system, the lines of force of which are inclined towards the working face; primary and auxiliary anodes; a screen arranged coaxially with the cathode; as well as a high-voltage igniting electrode. The cathode is made as a rectangular plate and the magnetic stabilizing system is comprised of mutually perpendicular linear conductors which form two subsystems. The first subsystem of linear conductors is the static magnetic stabilizing system and includes conductors arranged parallel to the longer plate edges. The conductors of the second subsystem, forming the dynamic magnetic stabilizing system, are arranged at right angles to the cathode face and are divided into sections. The conductors in each section are connected to the current source through a switch, and are successively engaged in turn. The direction of current in each of the linear conductors of the second subsystem (these conductors are located closer to the cathode) is the same and coincides with the direction of current in the vacuum arc.

The linear conductors are parallel to the long sides of the cathode and interconnected by circuit closing conductors. In the case of the conductors of the first subsystem, i.e. the conductors which form the static magnetic stabilizing system, distance S between the circuit closing conductors and the side surface of the plate (cathode) and distance L between the linear conductors conform to the relationship:

$$L \leq S \leq 3L$$

If S is less than or equal to L, the electric arc concentrates in the centre of the working face of the cathode which results in reduction of the efficiency of the cathode and in a decrease in the dimensions of the articles that can be coated.

If S>3L, the efficiency of the process does not increase, and thus a further increase in the distance between the side surface of the cathode and the closing conductor is useless.

Each of the linear conductors can form a rectangular circuit. The linear conductors included in the static magnetic stabilizing system may form separate rectangular circuits located on both sides of the side surface of the cathode (see FIG. 3). The circuit closing conductors in this embodiment are located away from the cathode, to nullify their magnetic effect. In a further embodiment of the vacuum-arc plasma source the circuit closing conductors joining the linear conductors of the first group are arranged at right angles to the surface of the working face of the cathode (see FIG. 2).

All of these features are interrelated and aimed at the solution of one problem, which consists of the application of coatings to large and long articles the size of which, for example, ranges from 500 mm to 2 m and more.

The effective maintenance of cathodic spots within the working surface of the electrode can be accomplished through the use of the principles of motion of cathodic spots in the external non-uniform magnetic field. The basic principle is that the cathodic spot of a vacuum arc in a fairly strong magnetic field (~100 E), the force lines of which cross the surface of the cathode at acute angle $\alpha$, move in a direction perpendicular to the tangential component of the field in the reverse direction and, concurrently, displace towards angle $\alpha$ (for example, see "Cathodic Processes of Electric Arc" by Kesaev I. G., Nauka, 1968).

The cathode made in the form of a rectangular plate surrounded by the stabilizing magnetic system consisting of the dynamic and static stabilizing subsystems makes it possible to hold the cathodic spot of the vacuum arc on a flat surface dimensioned from 500 mm to 2 m and more. This, in turn, allows vacuum coatings to be produced on large and long articles of the same length.

SUMMARY OF THE INVENTION

The present invention thus provides an apparatus for producing coatings in a vacuum comprising a rectangular planar cathode plate and an anode arranged at right angles thereto, the cathode plate having long sides and short sides, the long sides being bevelled inwardly toward a working surface of the cathode plate, means for igniting an electric arc, and a magnetic stabilizing system comprising linear conductors arranged in parallel to the long sides of the cathode plate for producing a static magnetic field, and groups of linear conductors arranged perpendicular to the working surface of the cathode plate activated in sequence to produce a dynamic magnetic field.

BRIEF DESCRIPTION OF THE DRAWINGS

In drawings which illustrate by way of example only a preferred embodiment of the invention.

DETAILED DESCRIPTION OF THE INVENTION

Figure 1:
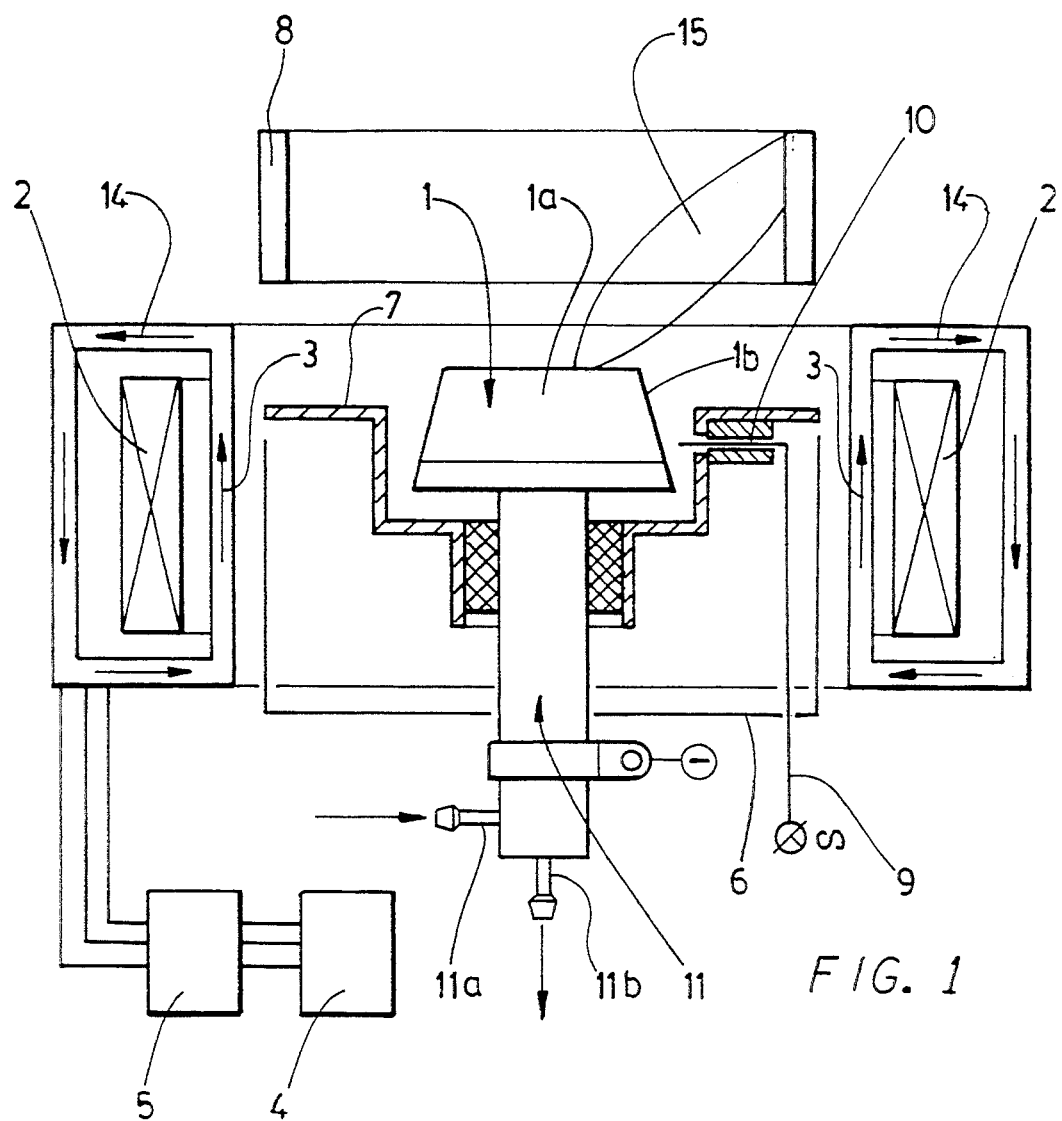
FIG. 1 is a schematic view of the vacuum-arc plasma source.

The vacuum-arc plasma source illustrated in FIG. 1 includes cathode 1 which has a working face 1a. The cathode 1 is made in the form of a rectangular plate. Adjacent to each long side surface 1b of the cathode is provided, in a preferred embodiment, a stabilizing magnetic system which is formed by linear conductors (preferably conductive rods or bars) combined into two subsystems: linear conductors 2 of the first subsystem are arranged parallel to the longer edges of the plate 1. They form the static magnetic stabilizing system. The direction of current is shown by the arrows in FIG. 3. Linear conductors 3 of the second subsystem are arranged at right angles to the working surface 1a of the cathode plate 1 and form the dynamic magnetic stabilizing system.

Figure 3:
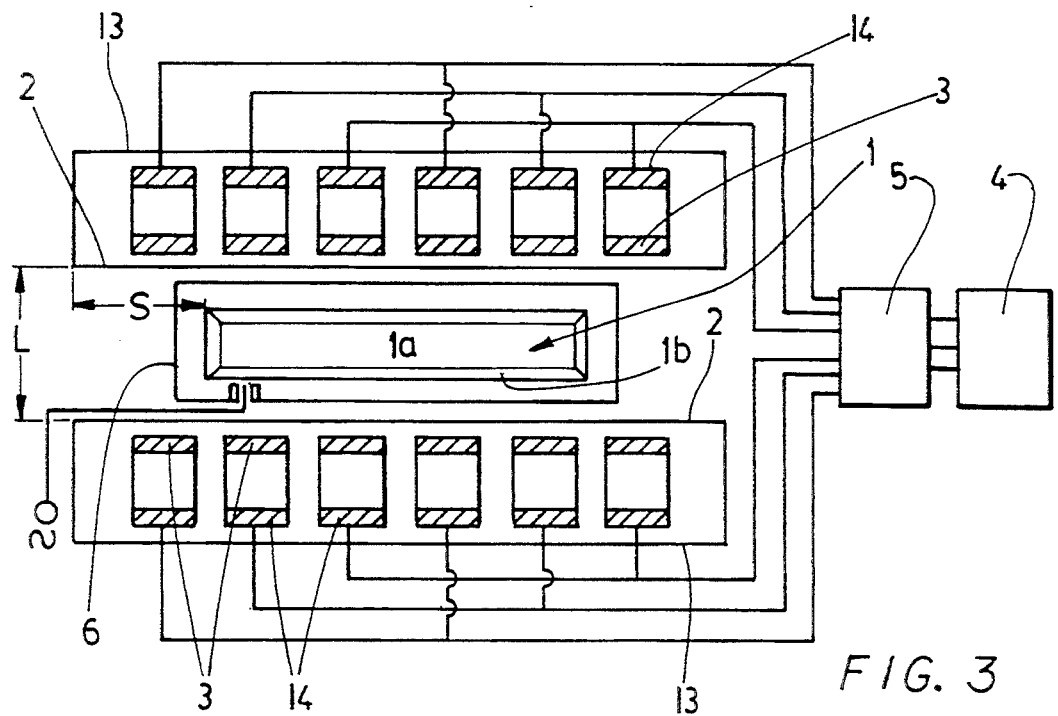
FIG. 3 is a schematic top view showing the cathode in the form of a rectangular plate surrounded by the magnetic stabilizing system formed by separate circuits arranged on both sides of the cathode, with the conductors of the dynamic magnetic stabilizing system shown in cross-section.

The conductors 3 are divided into groups (for example, three groups each of which includes two or three conductors 3 as shown in FIG. 3). The conductors 3 in each group are connected to current source 4 through a sequencing switch 5 that activates the groups in sequence. In the process of the plasma source operation the current direction in all of the conductors 3 of the second subsystem (nearest the cathode plate 1) is the same and coincides with the direction of the vacuum arc current, as shown by the arrows in FIG. 1. As the plasma source operates, a moving tangential magnetic field which causes the cathode spots to move in the reverse direction, i.e. toward the working face 1a of the cathode, develops near the side surface 1b of the cathode plate 1.

In order to effect the dynamic magnetic stabilizing subsystem, one should fulfil the following conditions: the time between the successive switching of the groups of conductors 3 should be the following:

$$t_{delay} = d_C / V_{CS} \qquad \text{a)}$$

where
  $d_C$ is the width (top to bottom) of the cathode side surface; and
  $V_{CS}$ the average velocity of cathodic spots on the cathode surface; and $$V_{CS} = cIB, \qquad \text{b)}$$

where
  I is the arc current;
  B is the magnitude of the tangential magnetic field magnetic induction near the cathode surface; and
  c is the coefficient that compensates for the cathode material (see the "Cathodic processes of electric arc" by Kesaev I. G., M.: Nauka, 1968).

The plasma source is made up of screen 6, auxiliary anode 7 and primary anode 8 arranged coaxially with the cathode plate 1, and high-voltage igniting electrode 9 with a water-cooled portion mounted in a dielectric sleeve 10.

There is a gap provided between the auxiliary anode 7 and the side surface 1b of cathode plate 1. The plasma source is conventionally secured in a water-cooled flange (not shown). Reference numeral 11 denotes the water-cooled portion of cathode plate 1, 11a and 11b identifying the water inlet and outlet, respectively. Mounted between auxiliary anode 7 and water-cooled portion 11 of the cathode plate 1 is an insulator 12.

Linear conductors 2 and 3 are provided with circuit closing conductors 13 and 14, respectively, which are in all cases oriented away from the cathode plate 1 because their sole function is to close the circuit so that a current will run through the linear conductors 2, 3, and the magnetic effect of closing conductors 13, 14 is nullified by orienting them away from the cathode plate 1.

Linear conductors 2 arranged parallel to the longer edges of the rectangular cathode plate 1 are interconnected by means of circuit closing conductors 13. The direction of current flow in linear conductors 2 is shown in FIG. 3. The distance S between closing conductor 13 and the side surface of the cathode plate 1 and the distance L between linear conductors 2 (see FIG. 3) should satisfy the relation:

$$L \leq S \leq 3L.$$

Figure 2:
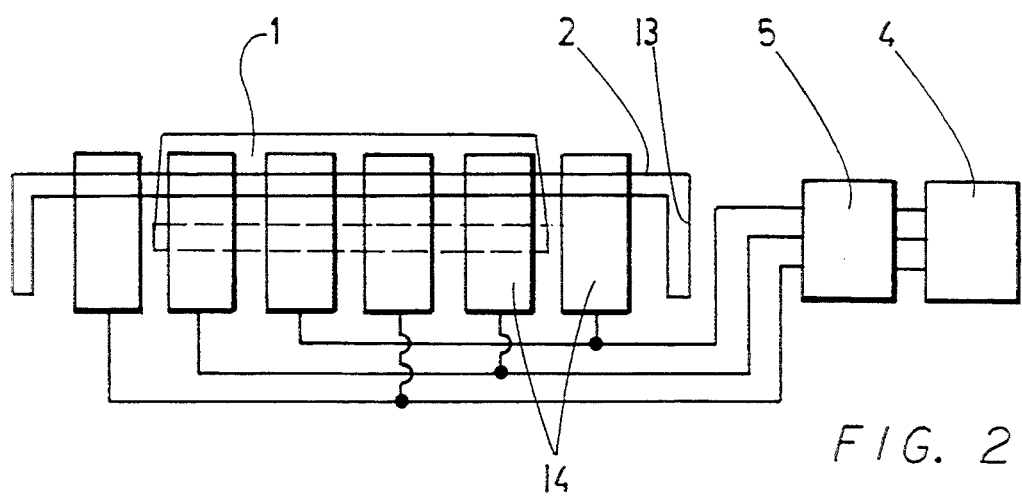
FIG. 2 is a schematic view showing the cathode surrounded by the magnetic stabilizing system in which the circuit closing conductors of the first subsystem are arranged in part at right angles to the surface of the working face of the cathode.

In a first embodiment, shown in FIG. 1, the linear conductors 2 on each side of the cathode plate 1 form a single circuit. In a second embodiment, illustrated in FIG. 2, separate circuits are provided on each side of the cathode plate 1 and portions of closing conductors 13 are arranged at right angles to the working surface 1a of cathode plate 1, oriented away from the cathode plate 1 to nullify their magnetic effect. In the third embodiment, shown in FIG. 3, the linear conductors 2 and closing conductors 13 form separate rectangular circuits on each side of the cathode plate 1.

The vacuum-arc plasma source operates as follows.

Figure 4:
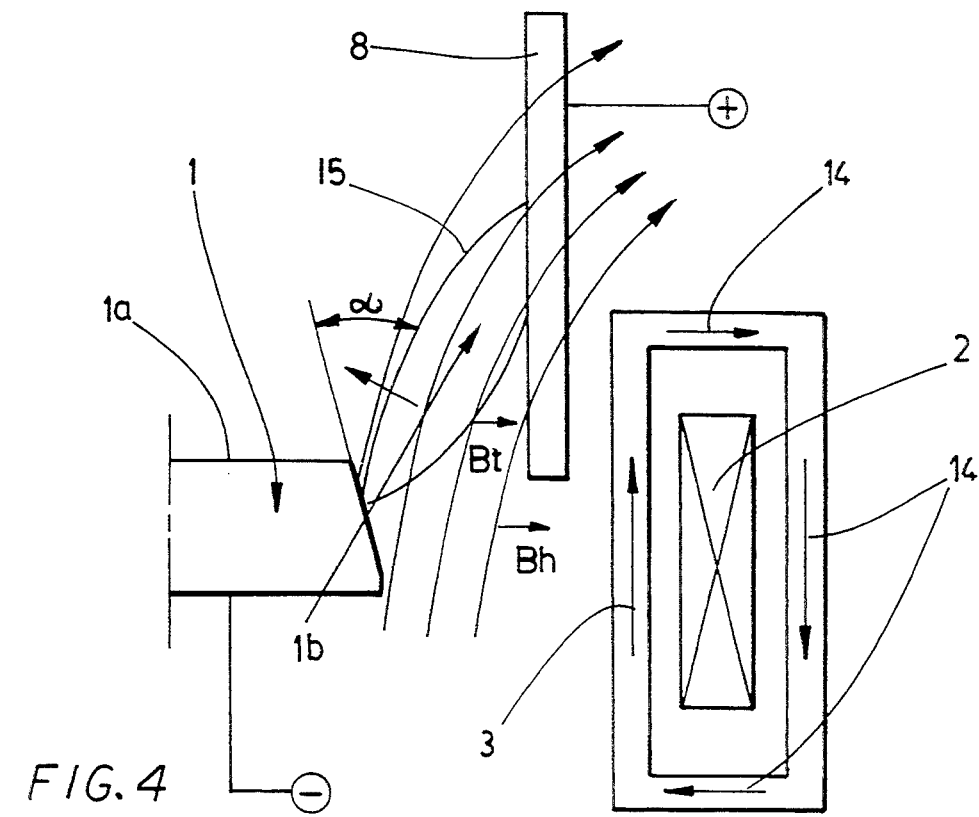
FIG. 4 is a diagrammatic representation showing the operating principle of the plasma source, in which the values are: $V_G$ is the average velocity of the cathodic spot, m/s, and $B_T$ is the induction vector of the tangential magnetic field created by the dynamic magnetic stabilizing subsystem.

A high pulse voltage applied to igniting electrode 9 initiates a vacuum arc 15 on the bevelled side surface 1b of cathode plate 1 (see FIG. 4). The vacuum arc is produced between the side surface 1b of the cathode plate 1 and the auxiliary anode 7. The resultant plasma bridges the primary discharge gap (between the cathode plate 1 and the primary anode 8). Cathode spots are moved off the side surface 1b of the cathode plate 1 and gather on its working face 1a (see FIG. 1) which is basically a flat surface whose length may reach 2 m or more.

A current, the direction of which coincides with the direction of current of vacuum arc 15, is produced in the linear conductors 3 arranged around the working face 1b of the cathode. These conductors 3 are connected to current source 4 through sequencing switch 5. They form the dynamic magnetic stabilizing subsystem. A current is applied to the groups of conductors 3 in the dynamic magnetic stabilizing subsystem in sequence, timed as described above. So long as the switching speed is faster than the velocity of a cathode spot, a dense circular magnetic wall (illustrated notionally in FIG. 4) occurs in the space around the electric arc 15. In conjunction with the magnetic field created by the static magnetic subsystem, it stabilizes the arc on the working surface 1a of the cathode plate 1.

The plasma flow consisting of positive ions generated by the cathodic spot located on the working face 1a of the cathode plate 1 of the vacuum-arc plasma source is forced towards the article, on which it is deposited as a coating.

EXAMPLE

An article, 600 mm in height, was mounted in the substrate holder for the production of a titanium nitride coating on it. For this purpose, a titanium cathode in the form of a rectangular plate was used. The plate dimensions were: 650 mm in length and 100 mm in width.

The length of the linear conductor 2 arranged along the longer edge of the cathode was 1200 mm.

Nitrogen was injected into the working chamber under a pressure of $10^{-1}$ Pa. The arc current was 200 A.

As a result, a fine coating was obtained with a thickness diversity of 5 percent.

The static and dynamic magnetic stabilizing subsystems were switched on.

Optimal magnitudes of distance S between the circuit closing conductor 13 and the side surface 1b of the plate 1, depending on the magnitude of distance L between the linear conductors 2, were determined. The obtained results are tabulated below.

TABLE

| No. | Distance Between Conductors 2 (L), mm | Distance Between Side Surface 1b of Plate 1 and Closing Conductor 13 (S), mm, | Result |
|---|---|---|---|
| 1. | 200 | 150 (S < L) | Narrow beam does not cover entire length |
| 2. | 200 | 275 (S < L 3L) | High-quality coating obtained on entire length of item |
| 3. | 200 | 200 (S = L) | Same |
| 4. | 200 | 650 (S > L) | Efficiency of process remained the same |

With the dynamic magnetic subsystem switch off, the stability of the arc glow on the working face 1a of the cathode was 2 to 3 times worse (the number of spontaneous quenchings of the arc per unit of time increased twice or thrice due to the appearance of cathodic spots on the side surface 1b of the cathode).

As is seen from the above example, the claimed invention, as opposed to the prior art, makes it possible to produce a high-quality coating on an article of up to 600 mm in height. The dimensions of the articles to be coated may be larger if the size of the cathode plate 1 is greater, for example 2 m.

I claim:

1. An apparatus for producing coatings in a vacuum comprising
   a rectangular planar cathode plate and an anode arranged at right angles thereto, the cathode plate having long sides and short sides, the long sides being bevelled inwardly toward a working surface of the cathode plate,
   means for igniting an electric arc, and
   a magnetic stabilizing system comprising linear conductors arranged in parallel to the long sides of the cathode plate for producing a static magnetic field, and groups of linear conductors arranged perpendicular to the working surface of the cathode plate activated in sequence to produce a dynamic magnetic field.

2. The apparatus defined in claim 1 in which the linear conductors parallel to the long sides of the cathode plate are interconnected and form a single circuit.

3. The apparatus defined in claim 1 in which the linear conductors arranged parallel to the long sides of the cathode plate each form a separate circuit with circuit closing conductors oriented away from the cathode plate relative to the linear conductor.

4. The apparatus as defined in claim 3 in which a portion of the circuit closing conductors is oriented perpendicularly to the cathode plate.

5. The apparatus as defined in claim 3 in which each circuit of linear conductor and closing conductors forms a rectangle on each side of the cathode plate.

6. The apparatus defined in claim 1 in which the distance S between the closing conductor and a side of the cathode plate, and the distance L between the linear conductors, satisfies the relation:

$$L \leq S \leq 3L.$$

7. The apparatus defined in claim 1 in which the groups of linear conductors in the magnetic stabilizing subsystem are successively activated according to the equation:

$$t_{delay} = d_C/V_{CS}$$

where $d_C$ is the top to bottom width of the cathode side surface and $V_{CS}$ the average velocity of cathodic spots on the cathode working surface, and $V_{CS} = cIB,$ where I is the arc current, B is the magnitude of the tangential magnetic field magnetic induction near the working surface of the cathode, and c is the coefficient that compensates for the cathode material.

8. The apparatus defined in claim 1 including a high voltage igniting electrode.

* * * * *